US006971079B2

(12) United States Patent
Yee et al.

(10) Patent No.: US 6,971,079 B2
(45) Date of Patent: Nov. 29, 2005

(54) ACCURACY OF TIMING ANALYSIS USING REGION-BASED VOLTAGE DROP BUDGETS

(75) Inventors: Gin Yee, Sunnyvale, CA (US); Pradeep Trivedi, Sunnyvale, CA (US); Sudhakar Bobba, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 203 days.

(21) Appl. No.: 10/245,972

(22) Filed: Sep. 18, 2002

(65) Prior Publication Data

US 2004/0054975 A1    Mar. 18, 2004

(51) Int. Cl.[7] ............................ G06F 17/50; G06F 9/45
(52) U.S. Cl. ..................... 716/6; 716/2; 716/5; 716/7; 716/11
(58) Field of Search ........... 716/1–2, 4–15; 703/13–19

(56) References Cited

U.S. PATENT DOCUMENTS

| 4,924,430 | A | * | 5/1990 | Zasio et al. ..................... 716/6 |
| 5,774,367 | A | * | 6/1998 | Reyes et al. .................... 716/2 |
| 6,028,440 | A | * | 2/2000 | Roethig et al. .............. 324/765 |
| 6,118,334 | A | * | 9/2000 | Tanaka et al. ............... 327/565 |
| 6,249,898 | B1 | * | 6/2001 | Koh et al. ...................... 716/4 |
| 6,311,310 | B1 | * | 10/2001 | Bernstein et al. ............... 716/2 |
| 6,336,207 | B2 | * | 1/2002 | Shinomiya et al. ............ 716/11 |
| 6,480,989 | B2 | * | 11/2002 | Chan et al. ..................... 716/8 |
| 6,665,843 | B2 | * | 12/2003 | Frech et al. .................... 716/4 |
| 6,675,139 | B1 | * | 1/2004 | Jetton et al. .................. 703/17 |
| 6,792,582 | B1 | * | 9/2004 | Cohn et al. ..................... 716/7 |
| 2003/0208737 | A1 | * | 11/2003 | Brenner et al. ............... 716/10 |
| 2004/0031008 | A1 | * | 2/2004 | Satoh et al. .................... 716/8 |

OTHER PUBLICATIONS

G Bai et al., "Simulation and Optimization of the Power Distribution Network in VLSI Circuits," 2000 IEEE/ACM Int'l Conference on CAD, pp. 481-486.*

* cited by examiner

Primary Examiner—Leigh M. Garbowski
(74) Attorney, Agent, or Firm—Osha Liang LLP

(57) ABSTRACT

A method and apparatus for improving the timing accuracy of an integrated circuit through region-based voltage drop budgets is provided. Further, a method for performing timing analysis on an integrated circuit partitioned into voltage drop regions is provided. During the timing analysis, a set of logic paths segments in each voltage drop region is tested to ensure that the integrated circuit meets a set of predefined timing requirements. Logic path segments that reside in different voltage drop regions are tested using a supply voltage inputted by the respective voltage drop region.

15 Claims, 6 Drawing Sheets

ACCURACY OF TIMING ANALYSIS USING REGION-BASED VOLTAGE DROP BUDGETS

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system.

At the center of modern computer systems are very large scale integrated circuits, often including millions of logic circuits within a very small area. The design of these integrated circuits is a difficult and time-consuming task. As a result, circuit simulations, i.e., preliminary circuit models used to measure chip performance, have proven to be valuable and often necessary tools for reducing the design time required to synthesize integrated circuits. Further, circuit simulations may be used to improve circuit design and guarantee functional correctness of the circuit. Thus, the development of accurate circuit simulation techniques is essential for a designer to keep pace with the ever-increasing complexity of an integrated circuit.

FIG. 1 shows a circuit simulation process used by a typical circuit simulation tool, e.g., a computer system. In FIG. 1, the circuit simulation process is broken down into three steps: system design analysis (12), logic design analysis (14), and circuit design analysis (16). First, a design specification (10), i.e., a system overview of an integrated circuit design, is used to perform the system design analysis (12) of the integrated circuit (IC). The system design analysis (12) breaks the design specification (10) into subsystems and specifies the characteristics of each subsystem. For example, a system design analysis may specify the number and types of memory devices, arithmetic devices, and input/output devices as well as the interconnection and control of these subsystems.

Next, the logic design analysis (14) is used to produce a more detailed description of the IC's subsystems. Specifically, the logic design analysis (14) determines which types of elementary logic components, e.g., logic gates, flip-flops, etc., are used to construct the subsystems as well as how these components are interconnected. For example, a logic design analysis may specify the interconnection of logic gates and flip-flops that are used by a particular arithmetic unit to perform binary addition.

After the logic design analysis (14), the circuit design analysis (16) is used to generate a circuit schematic (18) of the IC's logic components. The circuit design analysis (16) determines the types, sizes, and interconnections of the logic circuits, e.g., resistors, diodes, transistors, etc., used to form the logic components for each subsystem. For example, a circuit schematic generated by a circuit design analysis may include the specific configuration of resistors and transistors used to form a flip-flop used in particular input/output device.

In many cases, the quality of a circuit simulation tool is measured by its ability to meet and/or exceed predetermined design performance goals. For example, circuit simulation tools are often used to minimize the amount of power dissipated by on-chip logic components. For small and/or portable electronic devices, high power dissipation may impede a designer's ability to design an adequate and/or cost-effective cooling system for a device. In addition, high power dissipation by on-chip logic components typically increases the amount of power consumed by an electronic device.

One manner in which designers optimize the power dissipation of a particular IC is through effective design of the IC's power grid, which is used to provide supply voltage and ground to the logic components of the IC's subsystems. Generally, a power grid is designed as a stack of wire meshes attached to a surface of the IC, wherein each wire mesh is attached to a voltage supply or to ground. Further, at various locations on the IC, each wire mesh is wired to one more logic components so that, ideally, each location on the IC receives sufficient supply voltage to operate correctly.

When logic gates on an integrated circuit transition, the logic gates draw current from or sink current to the power grid. Because the flow of current through the power grid typically causes supply voltage variations, there is a propensity for the behavior of one transitioning logic gate to affect the behavior of another logic gate on the integrated circuit. For example, when a transitioning logic gate sinks/draws a large amount of current to/from the power grid, other logic gates in close proximity to the transitioning logic gate may see a sudden surge/drop in supply voltage. Surges/drops in supply voltage may corrupt the signals outputted by these other logic gates by causing the signals to transition too early or too late, i.e., altering the timing delays of the signals. Consequently, these timing errors may propagate to other parts of the processor, thereby causing timing failures and/or circuit malfunction. Further, sudden surges/drops in supply voltage often increase the amount of power that is dissipated by the IC. For example, voltage surges may introduce excess power into the IC.

Typically, supply voltage variation in the power grid is minimized during the logic design analysis (14) and/or the circuit design analysis (16) of the circuit simulation process. FIG. 2 shows a circuit simulation technique that is used to minimize supply voltage variation during the design of an IC's power grid. First, a voltage drop budget, i.e., a margin of error for supply voltage variation, is set for the integrated circuit (step 20). The voltage drop budget, which is typically set to the worst-case voltage drop seen on the IC, is used to ensure that the IC's supply voltage is high enough for every logic gate on the IC to continuously receive at least the correct supply voltage. For example, if an IC that expects to see a supply voltage of 5 volts is found to have a worst-case voltage drop of 1 V at the center the IC, then it is the designer's responsibility to redesign the power grid such that the IC continuously receives at least 6 volts of supply voltage. Thus, although the outer edges of the IC may receive more than 5 volts of supply voltage, the center of the IC will receive at least 5 volts of supply voltage.

Referring to FIG. 2, after the IC has been assigned a voltage drop budget, the power grid is designed to meet the voltage drop budget (step 22). Typically, this is accomplished by altering the width and/or length of certain wires in the power grid and/or by altering the number and/or locations of wires connecting the power grid to the IC's logic components. Next, a timing analysis is performed on the IC using the voltage drop budget (step 24). During the timing analysis, the IC's logic components are tested individually and collectively to ensure that each logic component and/or each logic path formed by a set of logic components (1) receives at least the correct supply voltage and (2) meets a set of predefined timing requirements. Any logic components that do not meet the IC's supply voltage requirement and/or predefined timing requirements are redesigned (step 26), i.e., resized or replaced with functionally equivalent logic components that adhere to the design specification.

Note that, although the process shown in FIG. 2 does significantly reduce power dissipation in most IC designs, some of the redesigned logic components may be considerably over-sized to meet the predefined timing requirements. Consequently, this can lead to over-design of logic paths that are not necessarily critical to the timing of the circuit. Thus, during the timing analysis, excessive design effort and time may be spent in the redesign of non-critical logic paths.

SUMMARY OF INVENTION

According to one aspect of the invention, a method for verifying that an integrated circuit meets predefined timing requirements comprises partitioning at least a portion of the integrated circuit into at least one voltage drop region, wherein the at least one voltage drop region inputs a supply voltage determined by a region-based voltage drop budget; characterizing a time delay for a logic path segment in the at least one voltage drop region using the supply voltage inputted by the at least one voltage drop region; and determining a critical path for the at least one voltage drop region using the time delay of the logic path segment.

According to another aspect, a method for verifying that an integrated circuit meets predefined timing requirements comprises determining at least one voltage drop regions for the integrated circuit; determining a supply voltage for the at least one voltage drop region; determining a critical path disposed within the at least one voltage drop region using the supply voltage; and configuring logic components of the critical path to meet the predefined timing requirements.

According to another aspect, a computer system comprises a processor; a memory; and instructions residing in the memory executable in the processor for partitioning at least a portion of the integrated circuit into at least one voltage drop region, wherein the at least one voltage drop region inputs a supply voltage determined by a region-based voltage drop budget; characterizing a time delay for a logic path segment in the at least one voltage drop region using the supply voltage inputted by the at least one voltage drop region; and determining a critical path for the at least one voltage drop region using the time delay of the logic path segment According to another aspect, a method for verifying that an integrated circuit meets predefined timing requirements comprises partitioning at least a portion of the integrated circuit into a set of voltage drop regions based on voltage drop data; computing time delays for logic path segments in at least one of the set of voltage drop regions; identifying a critically timed path for the computed time delays; and redesigning the critically timed path to meet a predefined timing requirement.

Other aspects and advantages of the invention will be apparent from the following description and the appended claims.

DETAILED DESCRIPTION

Embodiments of the present invention relate to a method and apparatus for improving the timing accuracy of an integrated circuit through region-based voltage drop budgets. Embodiments of the present invention further relate to a method for performing timing analysis on an integrated circuit partitioned into optimal voltage drop regions. Embodiments of the present invention further relate to a method for ensuring that an integrated circuit adheres to a preset timing specification.

Figure 1:
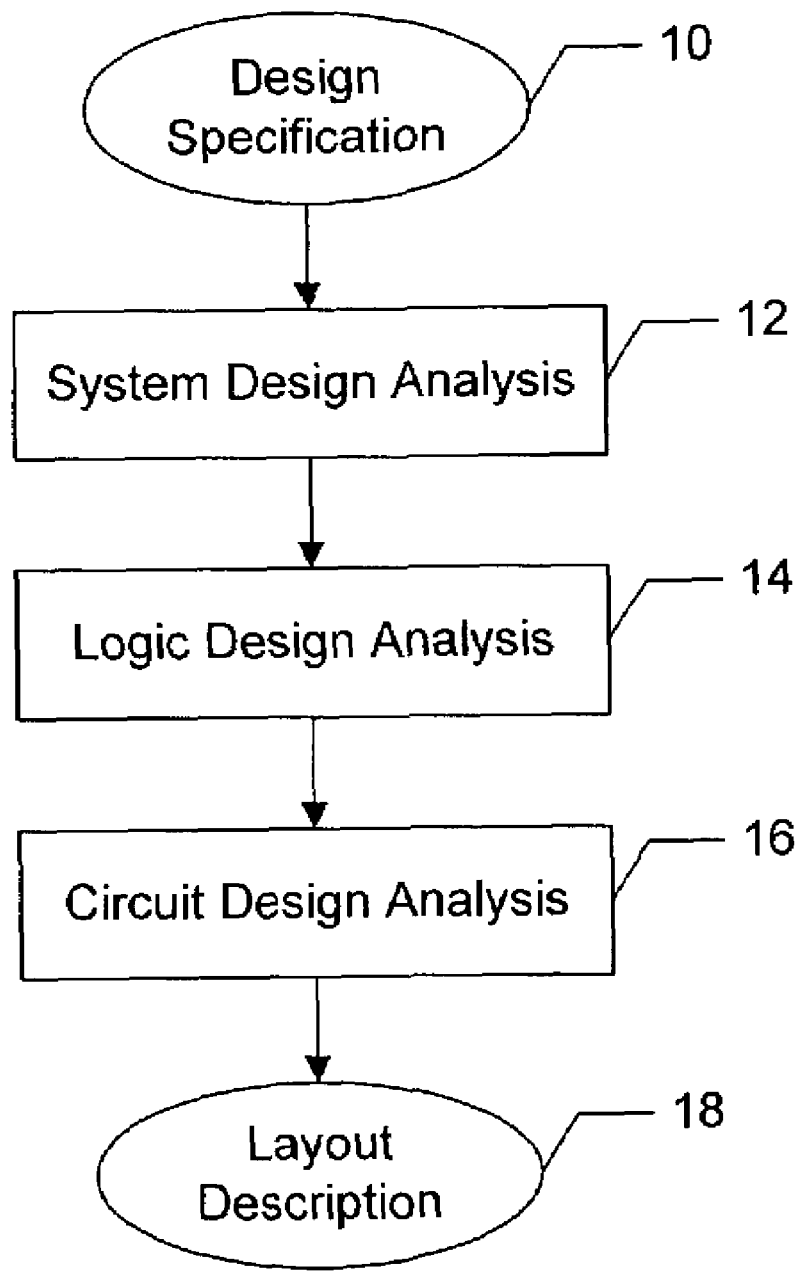
FIG. 1 shows a flow process of a typical circuit simulation process.
Figure 2:
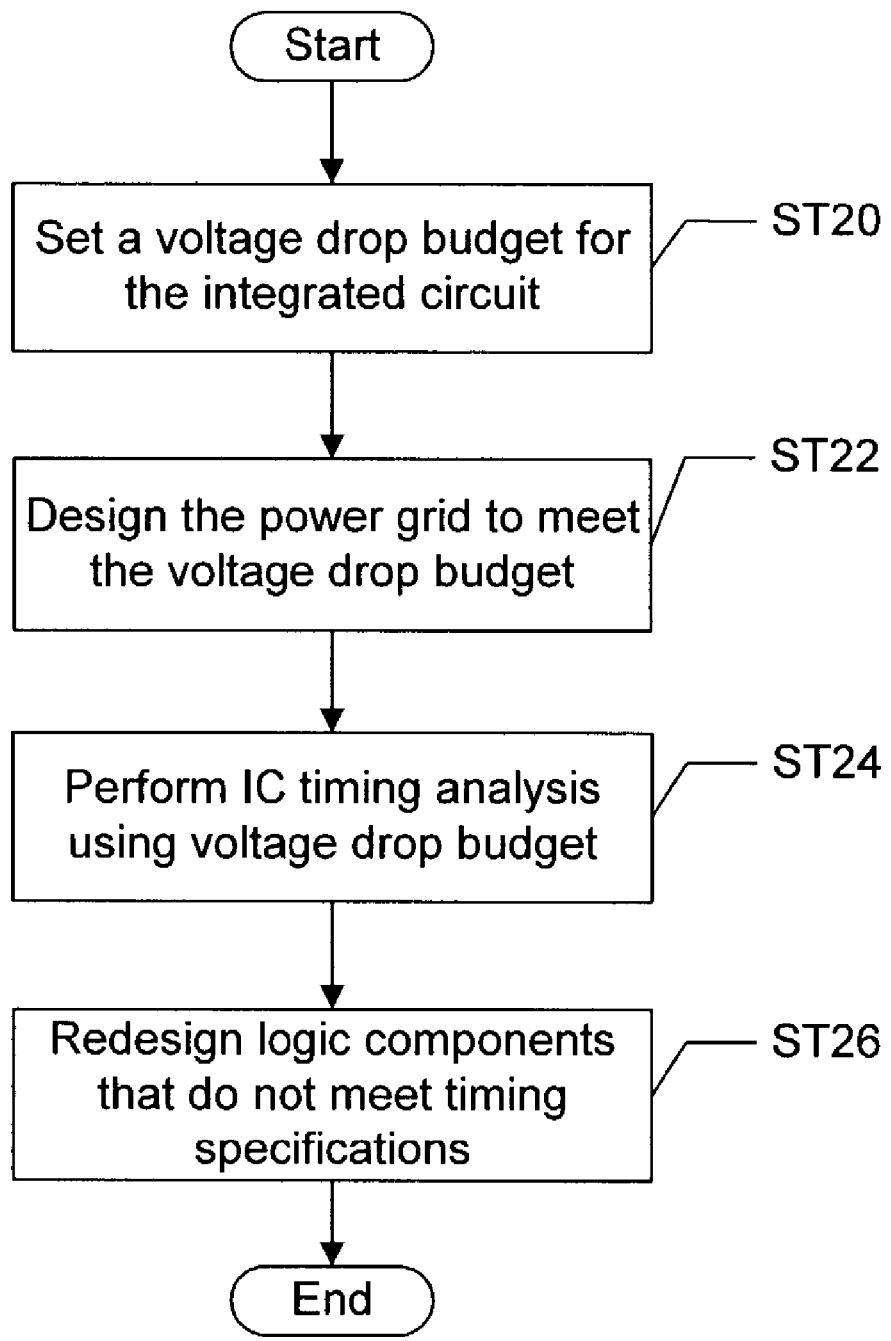
FIG. 2 shows a flow process of a typical power grid design process.
Figure 3:
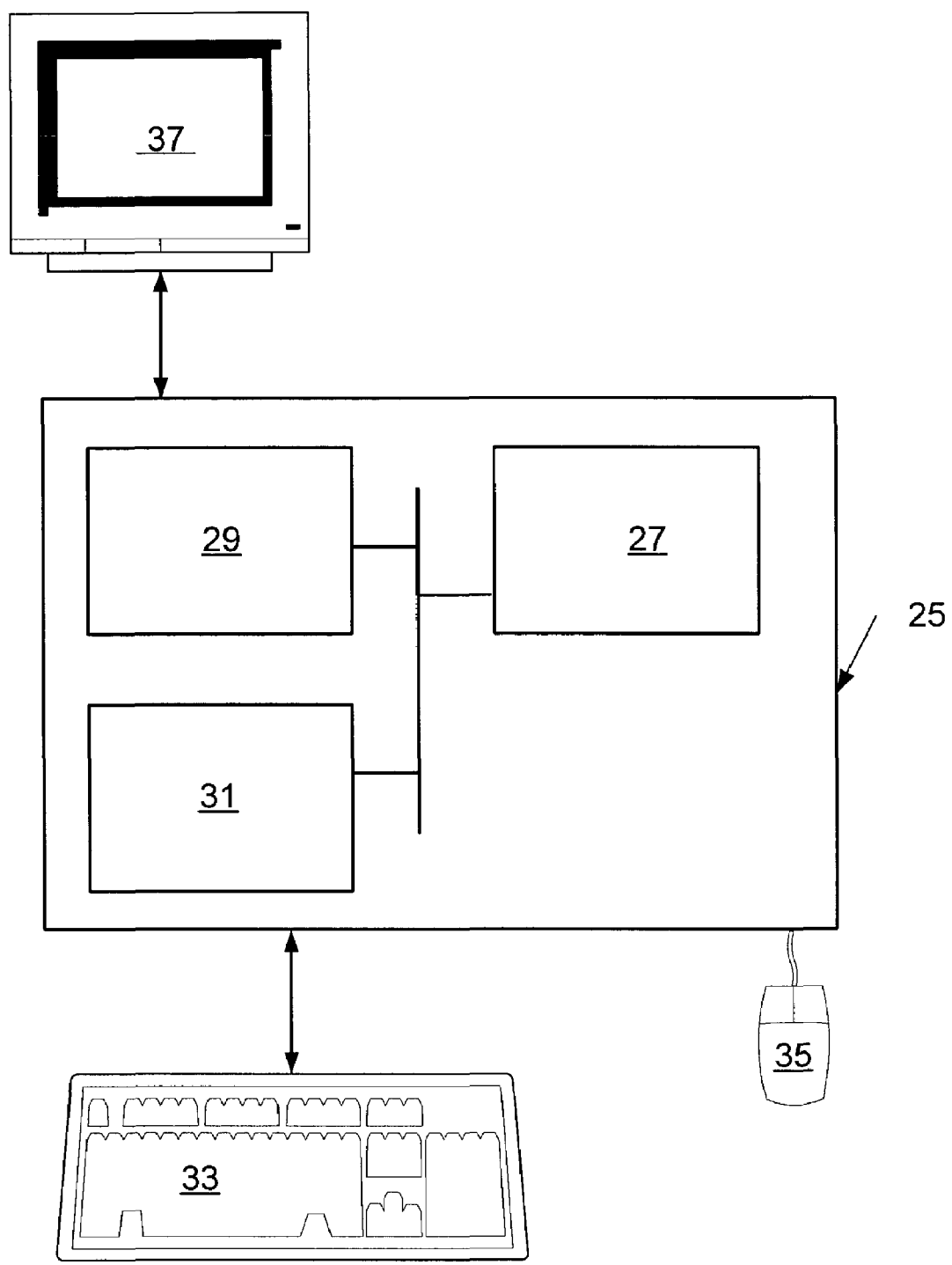
FIG. 3 shows a computer system in accordance with an embodiment of the present invention.

The present invention may be implemented on virtually any type of computer regardless of the platform being used. For example, as shown in FIG. 3, a typical computer (25) includes a processor (27), memory (29), a storage device (31), and numerous other elements and functionalities typical of today's computers (not shown). The computer (25) may also include input means, such as a keyboard (33) and a mouse (35), and output means, such as a monitor (37). Those skilled in the art will appreciate that these input and output means may take other forms in an accessible environment.

In one aspect, the present invention relates to a chip simulation technique in which a timing model is generated for an integrated circuit partitioned into multiple voltage drop regions, wherein each voltage drop region has been assigned a distinct region-based voltage drop budget. The timing model is then used to optimize the construction of IC logic paths that do not adhere to a preset timing specification, i.e., a set of timing requirements set forth by a designer and/or a design specification.

Note that, by assigning multiple voltage drop budgets to an integrated circuit, a designer may ensure that each IC location is assigned a voltage drop budget commensurate with the actual voltage drop experienced by the location. In other words, the designer may ensure that a voltage-starved logic component is assigned an appropriate voltage drop budget, while also ensuring that a neighboring logic component is not over-sized to meet the same voltage drop budget. For example, if an IC is found to have a much larger voltage drop at the center than at the outer edges, then the designer may assign the IC's center and the IC's outer edges different voltage drop budgets. Thus, the designer may reduce a quantity of logic components that are over-sized to meet the timing specifications. Thus, the designer may improve accuracy in IC timing analysis by ensuring that fewer non-critical paths are redesigned.

FIGS. 4a–4d show four separate partitioning schemes used to partition an integrated circuit into a set of voltage drop regions in accordance with embodiments of the present invention. For each partitioning scheme, a different voltage drop criteria, i.e., a different cause of voltage drop, is used to approximate the worst-case voltage drop at various locations on the IC. The voltage drop criteria and, thus, the type of partitioning scheme, used for a particular IC is dependent on the level of design information available on the IC's floorplan.

Note that, for most IC designs, the level of design information available is determined by the completeness of the circuit simulation process. For example, more complete design information may be available for a first IC that has gone through circuit design analysis than for a second IC that has only gone through logic design analysis. As a result, a more involved voltage drop analysis and, thus, a more advanced partitioning scheme may be used for the first IC than for the second IC.

Figure 4A:
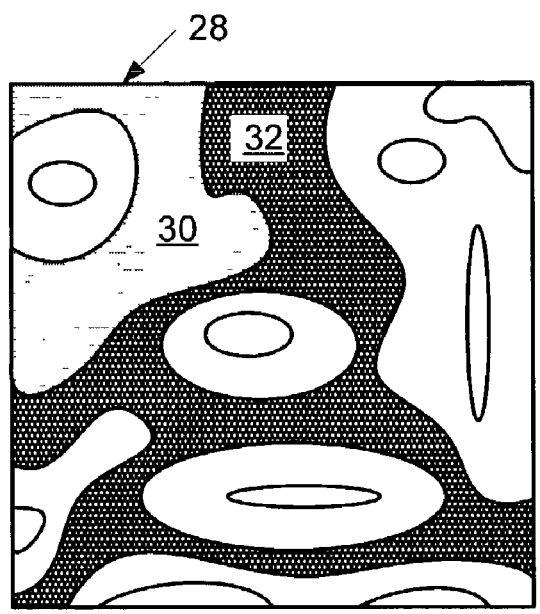
FIGS. 4a–4d show partitioning schemes in accordance with an embodiment of the present invention.

Referring to FIG. 4a, an integrated circuit (28) is partitioned into contour-based voltage drop regions, wherein the dimensions of the contour-based regions are based on a full-grid voltage drop analysis of the IC (28). The full-grid voltage drop analysis is used to simulate a worst-case voltage drop model that includes an approximation of the worst-case voltage drop for each location of the IC (28). Two adjacent contour-based voltage drop regions, referred to herein as a first contour-based voltage drop region (30) and a second contour-based voltage drop region (32), are shown as shaded regions in FIG. 4a. The first and second contour-based voltage drop regions (30, 32) each include neighboring logic components and/or gates that are indicated in the worst-case voltage drop model as experiencing similar voltage drop. For example, in one or more embodiments, the first contour-based voltage drop region (30) may include logic components and/or gates that experience a voltage drop of 0.5 to 0.6 volts while the second contour-based voltage drop region (32) may include logic components and/or gates that experience a voltage drop of 0.2 to 0.4 volts.

Figure 4B:
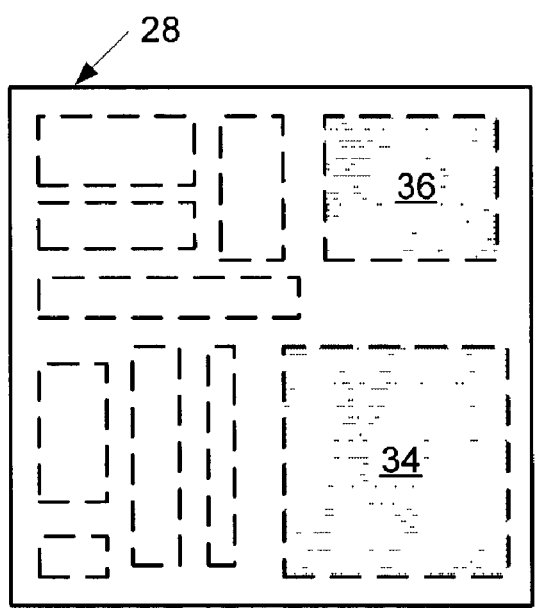

In FIG. 4b, the integrated circuit (28) is partitioned into block-based regions, wherein the dimensions of the block-based voltage drop regions are based on the sizes and locations of the IC's subsystems. Two block-based voltage drop regions, referred to herein as a first block-based voltage drop region (34) and a second block-based voltage drop region (36), are shown as shaded regions in FIG. 4b. The first and second block-based voltage drop regions (34, 36) each include neighboring logic components and/or gates that belong the same subsystem of the IC (28). For example, in one or more embodiments, the first block-based voltage drop region (34) may include logic components and/or gates that form a memory device while the second block-based voltage drop region (36) may include logic components and/or gate that form an input/output device.

Figure 4C:
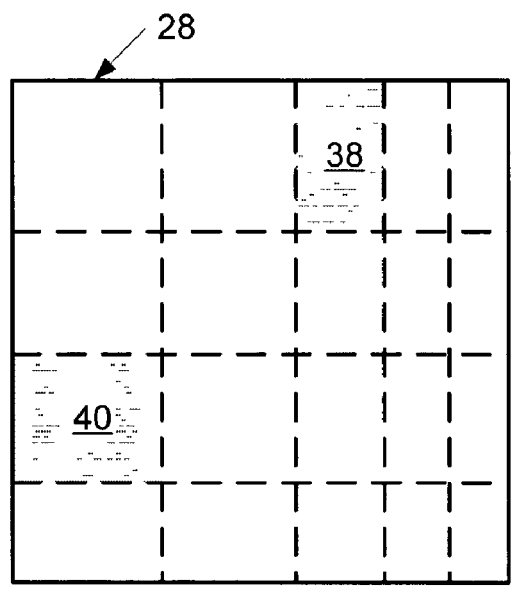

In FIG. 4c, the integrated circuit (28) is partitioned into non-uniformly sized voltage drop regions, wherein the dimensions of the non-uniformly sized voltage drop regions are based on the densities of particular types of logic gates and/or circuits in various locations across the IC (28). Two non-uniformly sized voltage drop regions, referred to herein as a first non-uniformly sized voltage drop region (38) and a second non-uniformly sized voltage drop region (40), are shown as shaded regions in FIG. 4b. The first and second non-uniformly sized voltage drop regions (38, 40) each include a certain number of a particular type of logic gate and/or circuit.

For example, in one or more embodiments, both the first and second non-uniformly sized voltage drop regions (38, 40) may each include 20 decoupling capacitors. Note that, in FIG. 4c, the first non-uniformly sized region (38) is smaller than the second non-uniformly sized region (40). For the example given, this means that, because both voltage drop regions have 20 decoupling capacitors, the first non-uniformly sized voltage drop region (38) has a greater density of decoupling capacitors than the second non-uniformly sized voltage drop region (40).

Figure 4D:
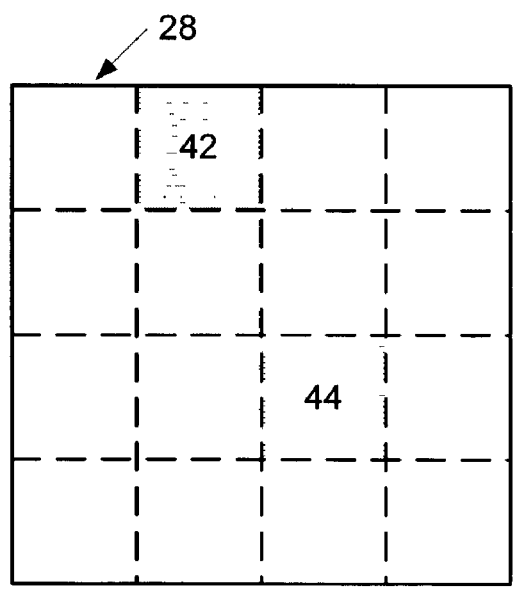

Referring to FIG. 4d, the integrated circuit (28) is partitioned into uniformly sized voltage drop regions, i.e., regions with equal dimensions. In one or more embodiments, the dimensions of the uniformly sized voltage drop regions may be based on an amount of area on the IC's surface and/or on a bump grid pattern of the IC's surface. Two uniformly sized voltage drop regions, referred to herein as a first uniformly sized voltage drop region (42) and a second uniformly sized voltage drop region (44), are shown as shaded regions in FIG. 4b. Note that, although the first and second uniformly size regions are shown as square regions, any dimension may be used that ensures that the voltage drop regions are uniformly sized.

Figure 5:
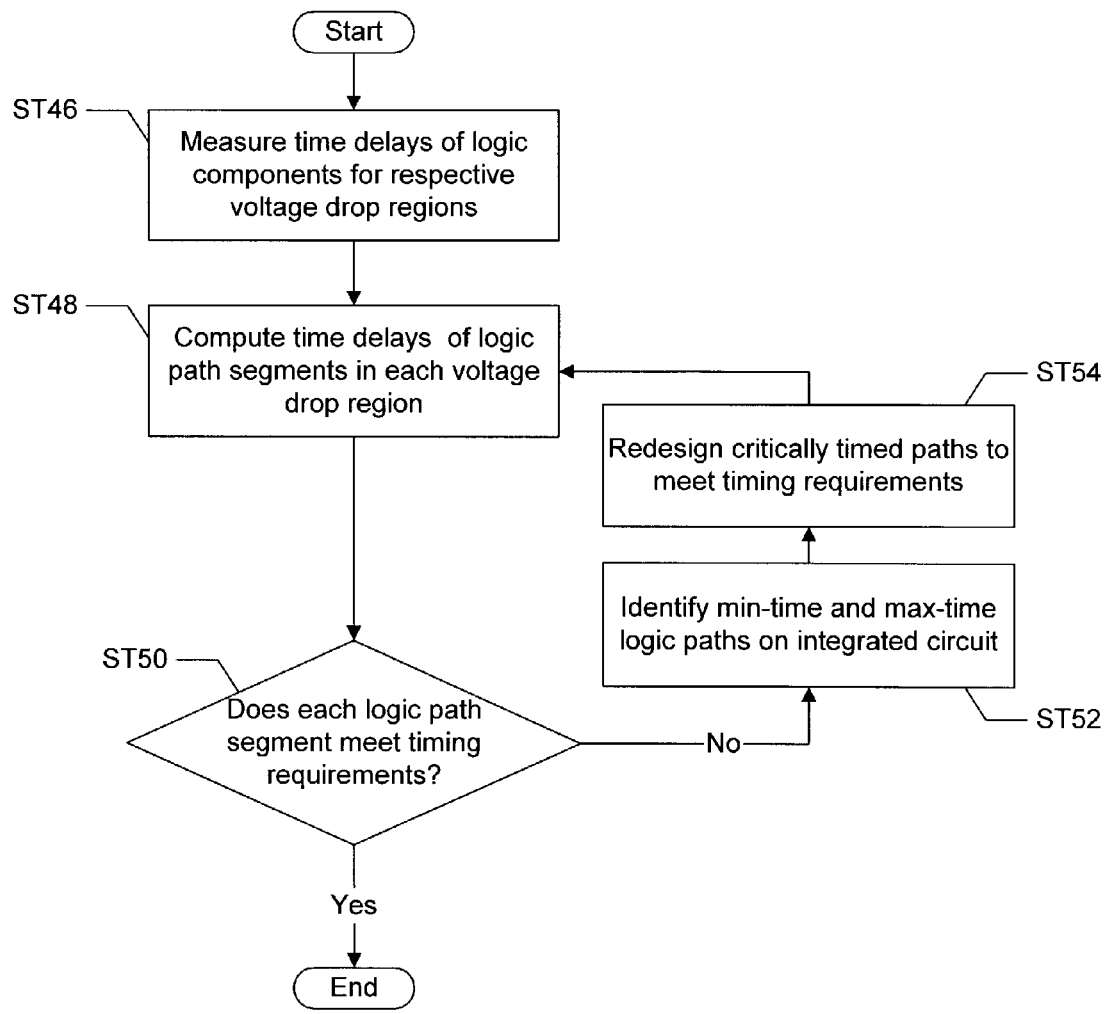
FIG. 5 shows a flow process for a timing analysis in accordance with an embodiment of the invention.

FIG. 5 shows a flow process for a timing analysis in accordance with an embodiment of the present invention. In the timing analysis shown in FIG. 5, an IC partitioned with one of the partitioning schemes as shown in FIGS. 4a–4d is analyzed to ensure that the IC meets a predefined timing specification. During the timing analysis, the IC's logic paths are tested to ensure that each logic path exhibits a time delay, i.e., an amount of time required to propagate a logic signal, that adheres to the predefined timing requirements. The time delay of each logic path is measured by applying a particular supply voltage to the logic path and then measuring how much time is needed to propagate various input signals at that supply voltage. Note that, because the IC is partitioned, a particular logic path may cross more than one voltage drop region, and thus, may be exposed to multiple levels of supply voltage. Therefore, logic path segments that reside in different voltage drop regions are tested using the supply voltage of the respective voltage drop region.

First, to determine the time delay of each logic path segment, the time delays of the logic path segments' logic components are measured for the respective voltage drop regions (step 46). For each voltage drop region, this is accomplished by generating a logic delay model that includes a time delay for each type of logic component using the respective supply voltage.

Next, each logic delay model is used to compute the time delays of the logic path segments in the respective voltage drop regions (step 48). For each logic path segment, the time delay of the entire logic path segment is computed by summing the time delays of relevant logic components in the logic delay model. Once the time delays of the IC's logic path segments have been computed, the logic path segments are checked to determine whether or not the respective time delays meet the predefined timing requirements (step 50).

Logic path segments whose time delays do not meet the predefined timing requirements may need to be redesigned in order to ensure that the IC operates correctly. To this end, the next step is to identify any logic path segments that qualify as min-time paths, i.e., logic path segments whose time delays are shorter than a particular predefined timing requirement (such as a clock signal), or as max-time paths, i.e., logic path segments whose time delays are longer than a particular predefined timing requirement (step 52).

Dependent on the supply voltage inputted to a particular min-time or max-time path, the logic path segment may qualify as a critical path, i.e., a logic path segment whose timing problem is so severe that logic signals propagated along the logic path segment become irreparably corrupted. In the case of min-time paths, min-time paths that occur in voltage drop regions with high supply voltages are likely to qualify as critical paths. For example, in a voltage drop region having a higher supply voltage, surges/spikes in the supply voltage may significantly reduce the time delay of any logic path segment. Consequently, because the time delay of a min-time path is already shorter than the predefined timing requirement, a surges/spikes in the supply voltage may cause the time delay to decrease so much that the min-time path becomes a critical path.

In the case of max-time paths, max-time paths that occur in voltage drop regions with low supply voltages are likely to qualify as critical paths. For example, in a voltage drop region having a lower supply voltage, drops in the supply voltage may significantly increase the time delay of any logic path segment. Consequently, because the time delay of a max-time path is already longer than the predefined timing requirement, a drop in the supply voltage may cause the time delay to increase so much that the max-time path becomes a critical path. Referring to FIG. 5, once the critical paths have been identified, each critical path is redesigned to meet the predefined timing requirements (step 54). For each critical path, certain logic components may be resized or replaced.

Note that, all or part of the process shown FIG. 5 may be repeated as many times as are required to optimize the timing of a particular IC design. Thus, the time spent in IC optimization and the level of optimization performed on a particular IC design are arbitrarily set by a designer and/or the requirements of a design specification.

Those skilled in the art will understand that the techniques presented above to assign region-based voltage drop budgets may be applied to portions of an integrated circuit instead of the IC as a whole.

Advantages of the present invention may include one or more of the following. In one or more embodiments, because an integrated circuit is partitioned into voltage drop regions, a designer may ensure that each IC location is assigned a voltage drop budget commensurate with the actual voltage drop experienced by the location. Thus, the designer may reduce a quantity of logic components that are over-sized to meet the timing specifications. By doing so, the designer may improve accuracy in IC timing analysis by ensuring that fewer non-critical paths are redesigned.

In one or more embodiments, because logic path segments that reside in different voltage drop regions are tested using the supply voltage of the respective voltage drop region, more accurate time delays may be computed for logic paths that cross multiple voltage drop regions.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for verifying that an integrated circuit meets predefined timing requirements, comprising:
    partitioning at least a portion of the integrated circuit into at least one voltage drop region, wherein the at least one voltage drop region inputs a supply voltage determined by a region-based voltage drop budget;
    characterizing a time delay for a logic path segment in the at least one voltage drop region using the supply voltage inputted by the at least one voltage drop region; and
    determining a critical path for the at least one voltage drop region using the time delay of the logic path segment.

2. The method of claim 1, further comprising redesigning the critical path to meet the predefined timing requirements.

3. The method of claim 1, wherein characterizing the time delay of the logic path segment comprises:
    determining a set of logic components included in the logic path segment;
    computing a time delay for each type of logic component using the supply voltage inputted by the at least one voltage drop region; and
    summing the time delays of the set of logic components.

4. The method of claim 1, wherein the critical path is a min-time path.

5. The method of claim 1, wherein the critical path is a max-time path.

6. The method of claim 1, wherein the partitioning the at least a portion of the integrated circuit comprises:
    determining a voltage drop criteria for the at least a portion of the integrated circuit;
    analyzing the at least a portion of the integrated circuit for worst-case voltage drop data using the voltage drop criteria;
    partitioning the at least a portion of the integrated circuit into another at least one voltage drop region based on the worst-case voltage drop data, wherein the another at least one voltage drop region is assigned a region-based voltage drop budget based on a worst-case voltage drop seen by the another at least one voltage drop region.

7. A method for verifying that an integrated circuit meets predefined timing requirements, comprising:
    determining at least one voltage drop region for the integrated circuit;
    determining a supply voltage for the at least one voltage drop region;
    determining a critical path disposed within the at least one voltage drop region using the supply voltage; and
    configuring logic components of the critical path to meet the predefined timing requirements.

8. The method of claim 7, wherein the voltage value of the supply voltage is based on a worst-case voltage drop for the at least one voltage drop region.

9. A computer system, comprising:
    a processor;
    a memory; and
    instructions residing in the memory executable in the processor for partitioning at least a portion of the integrated circuit into at least one voltage drop region, wherein the at least one voltage drop region inputs a supply voltage determined by a region-based voltage drop budget;
        characterizing a time delay for a logic path segment in the at least one voltage drop region using the supply voltage inputted by the at least one voltage drop region; and
        determining a critical path for the at least one voltage drop region using the time delay of the logic path segment.

10. The computer system of claim 9, further comprising instructions for redesigning the critical path to meet the predefined timing requirements.

11. The computer system of claim 9, wherein characterizing the time delay of the logic path segment comprises:
    determining a set of logic components included in the logic path segment;
    computing a time delay for each type of logic component using the supply voltage inputted by the voltage drop region; and
    summing the time delays of the set of logic components.

12. The computer system of claim 9, wherein the critical path is a min-time path.

13. The computer system of claim 9, wherein the critical path is a max-time path.

14. The computer system of claim 9, wherein the instructions for partitioning the at least a portion of the integrated circuit comprise instructions for:
    ascertaining a voltage drop criteria for the integrated circuit;
    analyzing the integrated circuit for worst-case voltage drop data using the voltage drop criteria;

partitioning the integrated circuit into another at least one voltage drop region based on the worst-case voltage drop data, wherein the another at least one voltage drop region is assigned a region-based voltage drop budget based on a worst-case voltage drop seen by the another at least one voltage drop region.

15. A method for verifying that an integrated circuit meets predefined timing requirements, comprising:

partitioning at least a portion of the integrated circuit into a set of voltage drop regions based on voltage drop data;

computing time delays for logic path segments in at least one of the set of voltage drop regions, wherein at least one of the set of voltage drop regions inputs a supply voltage determined by a region-based voltage drop budget;

identifying a critically timed path for the computed time delays; and redesigning the critically timed path to meet a predefined timing requirement.

* * * * *